(12) United States Patent
Fukaya et al.

(10) Patent No.: US 10,712,654 B2
(45) Date of Patent: *Jul. 14, 2020

(54) PHOTOMASK BLANK

(71) Applicant: Shin-Etsu Chemical Co., Ltd., Tokyo (JP)

(72) Inventors: Souichi Fukaya, Echizen (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 134 days.

This patent is subject to a terminal disclaimer.

(21) Appl. No.: 15/902,583

(22) Filed: Feb. 22, 2018

(65) Prior Publication Data

US 2018/0259843 A1     Sep. 13, 2018

(30) Foreign Application Priority Data

Mar. 10, 2017 (JP) .................. 2017-046031

(51) Int. Cl.
*G03F 1/26* (2012.01)
*G03F 1/32* (2012.01)
*G03F 1/46* (2012.01)
*G03F 1/50* (2012.01)
*G03F 1/58* (2012.01)
(Continued)

(52) U.S. Cl.
CPC .................. *G03F 1/50* (2013.01); *G03F 1/26* (2013.01); *G03F 1/32* (2013.01); *G03F 1/46* (2013.01); *G03F 1/58* (2013.01); *G03F 1/80* (2013.01); *G03F 7/70283* (2013.01)

(58) Field of Classification Search
CPC ..... G03F 1/50; G03F 1/46; G03F 1/58; G03F 1/32; G03F 1/26; G03F 1/80; G03F 7/70283
See application file for complete search history.

(56) References Cited

U.S. PATENT DOCUMENTS

| 5,474,864 A | 12/1995 | Isao et al. |
| 2007/0212618 A1* | 9/2007 | Yoshikawa ............... G03F 1/32 430/5 |

(Continued)

FOREIGN PATENT DOCUMENTS

| EP | 2 594 993 A2 | 5/2013 |
| EP | 3 165 963 A1 | 5/2017 |

(Continued)

OTHER PUBLICATIONS

European Search Report for Appl. No. 18156696.9 dated Jul. 9, 2018.

*Primary Examiner* — Martin J Angebranndt
(74) *Attorney, Agent, or Firm* — Birch, Stewart, Kolasch & Birch, LLP

(57) ABSTRACT

A photomask blank has on a transparent substrate, an optional first film, a second film, a third film, and a fourth film. The first and third films are formed of silicon-containing materials which are resistant to chlorine base dry etching and removable by fluorine base dry etching. The second and fourth films are formed of chromium-containing materials which are resistant to fluorine base dry etching and removable by chlorine base dry etching. An etching clear time of the fourth film is longer than an etching clear time of the second film, on chlorine base dry etching.

22 Claims, 12 Drawing Sheets

(51) Int. Cl.
  *G03F 1/80*  (2012.01)
  *G03F 7/20*  (2006.01)

(56) References Cited

U.S. PATENT DOCUMENTS

| | | | | |
|---|---|---|---|---|
| 2007/0248897 A1* | 10/2007 | Yoshikawa | ............... | G03F 1/32 |
| | | | | 430/5 |
| 2012/0100466 A1* | 4/2012 | Hashimoto | ............... | G03F 1/46 |
| | | | | 430/5 |
| 2016/0377975 A1* | 12/2016 | Matsumoto | ............... | G03F 1/32 |
| | | | | 430/5 |
| 2018/0259842 A1* | 9/2018 | Inazuki | ................... | G03F 1/80 |

FOREIGN PATENT DOCUMENTS

| | | | |
|---|---|---|---|
| JP | 63-85553 A | 4/1988 | |
| JP | 7-140635 A | 6/1995 | |
| JP | 3093632 U | 5/2003 | |
| JP | 2003-195479 A | 7/2003 | |
| JP | 2003-195483 A | 7/2003 | |
| KR | 9501750 * | 2/1995 | ........... H01L 21/027 |

* cited by examiner

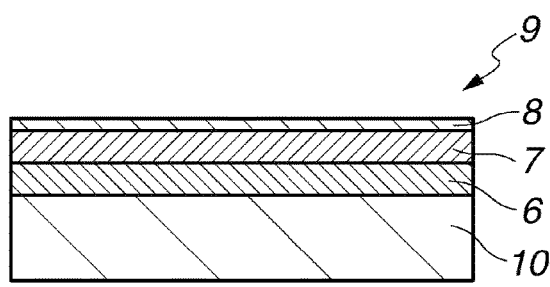
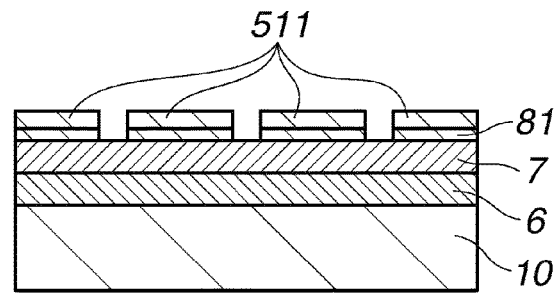
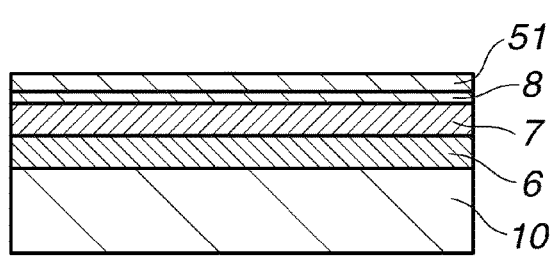
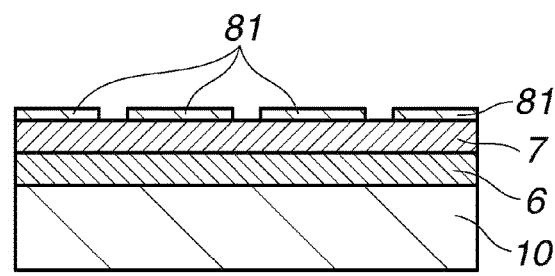
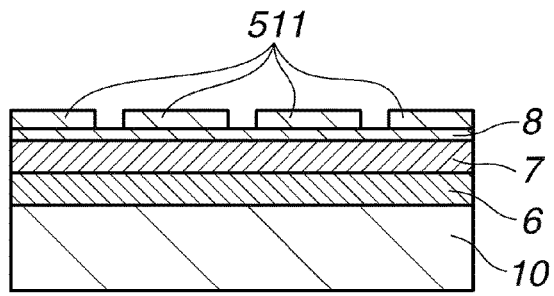
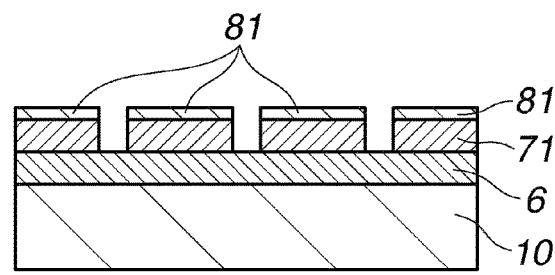

PHOTOMASK BLANK

CROSS-REFERENCE TO RELATED APPLICATION

This non-provisional application claims priority under 35 U.S.C. § 119(a) on Patent Application No. 2017-046031 filed in Japan on Mar. 10, 2017, the entire contents of which are hereby incorporated by reference.

TECHNICAL FIELD

This invention relates to a photomask blank which is processed into a photomask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of providing a phase shift of approximately 180 degrees between exposure light transmitted by a transparent section where no phase shift film is formed and exposure light transmitted by a (phase shift) section where the phase shift film is formed and having an insufficient transmittance to contribute to pattern formation. As the halftone phase shift photomask, there were proposed photomasks having a halftone phase shift film of molybdenum silicide oxide (MoSiO) or molybdenum silicide oxynitride (MoSiON) as disclosed in Patent Document 1, and photomasks having a halftone phase shift film of SiN or SiON.

In general, a photomask pattern is formed by furnishing a photomask blank having a light shielding film on a transparent substrate, coating a photoresist film on the blank, imagewise scanning the resist film with electron beam, developing the film to form a resist pattern, and etching the light shielding film into a light shielding pattern with the resist pattern used as an etching mask. It is desired to miniaturize the size of the light shielding pattern. If the resist film is processed while maintaining its thickness unchanged from that prior to miniaturization, then a ratio of film thickness to pattern size, known as aspect ratio, becomes high, and the shape of resist pattern features is degraded. This interferes with pattern transfer and sometimes causes the resist pattern to collapse or strip. Therefore, the thickness of resist film must be reduced to comply with miniaturization.

For the light shielding film which is etched using the resist pattern as an etching mask, a variety of materials have been proposed. In the commercial application, however, chromium compound films are used most often because of full knowledge of their etching behavior and their processing technique has been established as the standard. For example, light shielding films of chromium compounds are used in the photomask blank adapted for ArF excimer laser lithography, and specifically chromium compound films having a thickness of 50 to 77 nm are known from Patent Documents 2 to 4.

Typical of the dry etching to which chromium base films such as chromium compound films are subjected is oxygen-containing chlorine base dry etching, which often exerts an etching effect to organic films to a certain extent. When a chromium compound film is etched through a thin resist film pattern, accurate pattern transfer is difficult due to some etching of the resist film. It is a very difficult problem to require the resist to meet both a high resolution and sufficient etch resistance to enable a high accuracy of etching.

On the other hand, the attempt to use a hard mask in order to reduce the load on the resist during dry etching is common in the art. For example, Patent Document 5 describes that a $SiO_2$ film is formed on a $MoSi_2$ layer and used as an etching mask when $MoSi_2$ is dry etched with chlorine-containing gas. The $SiO_2$ film also functions as an antireflective film.

CITATION LIST

Patent Document 1: JP-A H07-140635
Patent Document 2: JP-A 2003-195479
Patent Document 3: JP-A 2003-195483
Patent Document 4: JP-U 3093632
Patent Document 5: JP-A S63-85553

SUMMARY OF INVENTION

While the photomask includes a photomask pattern-bearing region serving for pattern transfer, an outer frame pattern for shielding exposure light must be formed outside the photomask pattern-bearing region, that is, at the outer periphery of the photomask. Since the outer frame pattern must have a degree of light shielding enough to substantially shield exposure light, the film used for this purpose must have a substantial thickness. If the light shielding film used for formation of a photomask pattern is made thick so that the light shielding film may also serve as the film for outer frame pattern, then the problem that it is difficult to form a fine pattern in the light shielding film arises although the degree of light shielding in the outer frame region is ensured.

When a thick film is etched using a resist film as mask, the resist film must be thick. However, it is difficult to form a fine resist pattern from the thick resist film. When a thick chromium base film is subjected to chlorine base dry etching with an etchant gas containing chlorine gas and oxygen gas, through the pattern of chemically amplified resist as the etching mask, the etched film loses linearity on chlorine base dry etching.

In one method for forming a fine pattern by chlorine base dry etching without increasing the thickness of resist film, a hard mask film which is resistant to chlorine base dry etching is used. If the pattern of this hard mask film is used as an etching mask, the photomask pattern and outer frame pattern can be simultaneously formed. In this case, resist patterns corresponding to both the photomask pattern and the outer frame pattern are formed at the same time from the resist film deposited on the hard mask film. If negative resist is used, undesirably imaging of the resist pattern is time consuming.

Referring to FIGS. 11 and 12, a process involving the steps of forming a photomask pattern and then forming an outer frame pattern is described. First, there is furnished a photomask blank 9 including a phase shift film 6, a light shielding film 7 and a hard mask film 8 deposited in order on a transparent substrate 10, as shown in FIG. 11A. A first resist film 51 is coated onto the hard mask film 8 of the blank 9 (FIG. 11B). A first resist pattern 511 is formed from the first resist film 51 (FIG. 11C). With the first resist pattern 511 made etching mask, fluorine base dry etching is carried out to pattern the hard mask film 8 into a hard mask film pattern 81 (FIG. 11D). Then the first resist pattern 511 is removed (FIG. 11E). With the hard mask film pattern 81 made etching mask, chlorine base dry etching is carried out to pattern the light shielding film 7 into a light shielding film pattern 71 (FIG. 11F).

Next, fluorine base dry etching is carried out to remove the hard mask film pattern 81, and with the light shielding film pattern 71 made etching mask, the phase shift film 6 is patterned to form a phase shift film pattern 61 (FIG. 12A). A second resist film 52 is newly coated on the light shielding film pattern 71 and the bared substrate 10 (FIG. 12B). A second resist pattern 521 is formed from the second resist film 52 (FIG. 12C). With the second resist pattern 521 made etching mask, chlorine base dry etching is carried out to pattern the light shielding film pattern 71 to form an outer frame pattern 711 of light shielding film (FIG. 12D). Finally the second resist pattern 521 is removed, yielding a photomask 91 (FIG. 12E). When the photomask having the outer frame pattern 711 of light shielding film is prepared in this way, the second resist film 52 is formed in the recess of the photomask pattern as well, indicating a possibility that after removal of the second resist film 52, resist residues are left in the recess of the photomask pattern. This can cause defects to the photomask.

An object of the invention is to provide a photomask blank from which a photomask having both a fine photomask pattern and an outer frame pattern with a high degree of light shielding can be prepared via efficient steps at a high accuracy and with a minimized possibility of defect generation.

The inventors have found that a photomask blank is constructed as comprising a transparent substrate, a second film formed on the substrate optionally via a first film, a third film formed contiguous to the second film, and a fourth film formed contiguous to the third film, wherein the first and third films are formed of materials which are resistant to chlorine base dry etching and removable by fluorine base dry etching, the second and fourth films are formed of materials which are resistant to fluorine base dry etching and removable by chlorine base dry etching, the second and fourth films are constructed such that an etching clear time of the fourth film on chlorine base dry etching under one set of conditions is longer than an etching clear time of the second film on chlorine base dry etching under the one set of conditions. When a photomask is prepared from the photomask blank, formation of a photomask pattern and formation of an outer frame pattern may be made separate in the pattern forming step of the photomask preparing method, that is, after the outer frame pattern is formed, the photomask pattern may be formed via simple steps. Thus a photomask meeting both a photomask pattern of fine size and an outer frame pattern with a high degree of light shielding can be prepared via efficient steps at a high accuracy and with a minimized possibility of defect generation.

The invention provides a photomask blank comprising a transparent substrate, a second film formed on the substrate optionally via a first film, a third film serving as a hard mask film formed contiguous to the second film, and a fourth film formed contiguous to the third film. The first and third films are formed of materials which are resistant to chlorine base dry etching and removable by fluorine base dry etching. The second and fourth films are formed of materials which are resistant to fluorine base dry etching and removable by chlorine base dry etching. The second and fourth films are constructed such that an etching clear time of the fourth film on chlorine base dry etching under one set of conditions is longer than an etching clear time of the second film on chlorine base dry etching under said one set of conditions.

In a preferred embodiment, a ratio of the etching clear time of the fourth film to the etching clear time of the second film is up to 5.

In a preferred embodiment, the first film is formed on the substrate and the second film is formed contiguous to the first film. Typically, the first film is a phase shift film.

In a preferred embodiment, the first film is absent and the second film is formed contiguous to the substrate.

In a preferred embodiment, the first and third films or the third film is formed of silicon-containing materials; the second and fourth films are formed of silicon-free, chromium-containing materials.

In a preferred embodiment, the second film is a light shielding film; and the second film has a thickness of 15 to 100 nm.

In a preferred embodiment, the third film has a thickness of 1 to 20 nm.

In a preferred embodiment, the third film is thinner than the second film; and the third film is thinner than the fourth film.

In a preferred embodiment, the fourth film has a thickness of 30 to 120 nm.

ADVANTAGEOUS EFFECTS OF INVENTION

Advantages are obtained when the photomask blank of the invention is processed into a photomask. In the pattern forming step of the photomask preparing method, after an outer frame pattern is formed, a photomask pattern is formed via simple steps. The previous formation of the outer frame pattern minimizes a possibility of defect generation due to resist residues.

BRIEF DESCRIPTION OF DRAWINGS

FIGS. 11A to 11F illustrate in cross-sectional view successive steps of a prior art method for preparing a photomask from a prior art photomask blank.

DESCRIPTION OF PREFERRED EMBODIMENTS

The invention provides a photomask blank comprising a transparent substrate (i.e., a substrate transparent to exposure light) such as a quartz substrate and second, third, and fourth films deposited thereon. A first film may be formed between the substrate and the second film. That is, the second film is formed on the substrate via the first film or without interposing the first film. The third film is formed contiguous to the second film; and the fourth film is formed contiguous to the third film. Each of the first, second, third and fourth films may be constructed by a single layer or a plurality of layers (two or more layers, typically 2 to 5 layers) meeting the etching properties defined below.

Figure 1A:
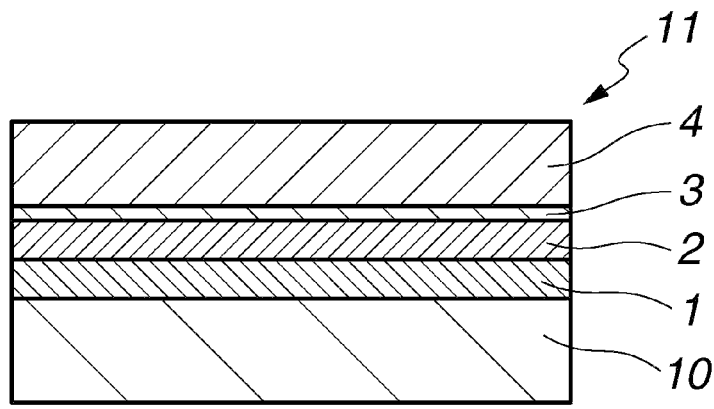
FIG. 1A is a cross-sectional view of a photomask blank in a first embodiment of the invention.

FIG. 1A is a cross-sectional view of a photomask blank in a first embodiment of the invention. The first embodiment is a photomask blank having a first film. The photomask blank depicted at 11 in FIG. 1A includes a transparent substrate 10, a first film 1 deposited contiguous to the substrate 10, a second film 2 deposited contiguous to the first film 1, a third film 3 deposited contiguous to the second film 2, and a fourth film 4 deposited contiguous to the third film 3.

Figure 2A:
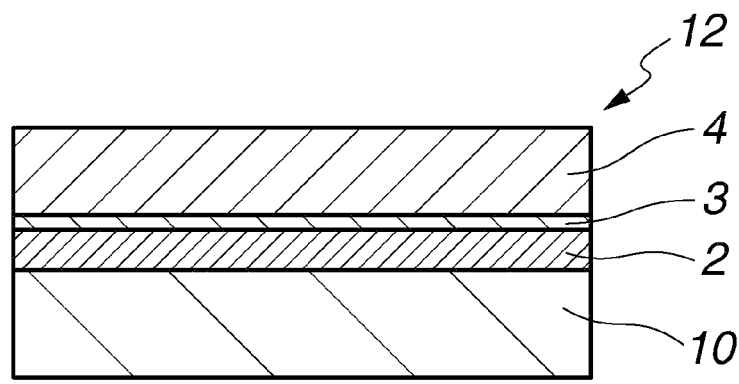
FIG. 2A is a cross-sectional view of a photomask blank in a second embodiment of the invention.

FIG. 2A is a cross-sectional view of a photomask blank in a second embodiment of the invention. The second embodiment is a photomask blank not having a first film. The photomask blank depicted at 12 in FIG. 2A includes a transparent substrate 10, a second film 2 deposited contiguous to the substrate 10, a third film 3 deposited contiguous to the second film 2, and a fourth film 4 deposited contiguous to the third film 3.

The first and third films are formed of materials which are resistant to chlorine base dry etching and removable by fluorine base dry etching. On the other hand, the second and fourth films are formed of materials which are resistant to fluorine base dry etching and removable by chlorine base dry etching. Namely, the first, second, third and fourth films are constructed such that any two adjacent films may have different etching properties, the second film may function as an etching mask (hard mask) for the transparent substrate or the adjoining first film on the substrate side, the third film may function as an etching mask (hard mask) for the adjoining second film on the substrate side, and the fourth film may function as an etching mask (hard mask) for the adjoining third film on the substrate side. As used herein, the term "chlorine base dry etching" refers to dry etching using as etchant a gas mixture of oxygen gas ($O_2$) and chlorine gas ($Cl_2$), optionally in admixture with a rare gas such as argon gas (Ar) or helium gas (He), namely oxygen-containing chlorine base dry etching. The term "fluorine base dry etching" refers to dry etching using as etchant a fluoride gas such as sulfur hexafluoride gas ($SF_6$) or carbon tetrafluoride gas ($CF_4$), optionally in admixture with oxygen gas ($O_2$) and a rare gas such as argon gas (Ar) or helium gas (He).

While the second and fourth films have like etching properties, these films may be constructed such that an etching clear time of the fourth film on chlorine base dry etching under one set of conditions is longer than an etching clear time of the second film on chlorine base dry etching under the one set of conditions (for chlorine base dry etching of the fourth film). As used herein, the term "etching clear time" refers to a time passed from the start of etching until complete removal of the film and is generally given as a film thickness (nm) divided by an etching rate (nm/sec).

According to the invention, the fourth film is deposited in addition to the first, second and third films or the second and third films. The fourth film is used to form an outer frame pattern or mask pattern first. That is, an outer frame pattern of the fourth film or a mask pattern of the fourth film for forming an outer frame pattern of the third film or an outer frame pattern of the second film can be formed before a mask pattern of the second film is formed using a mask pattern of the third film, and before a mask pattern of the first film is formed or a pattern is formed in the substrate using a mask pattern of the second film. Now that the fourth film is used to form an outer frame pattern or mask pattern first, the step of depositing a resist film in a photomask pattern-forming region after formation of a photomask pattern of the second film, after formation of a photomask pattern of the first film, or after formation of a pattern in the substrate, and forming a resist pattern therefrom becomes unnecessary. This avoids the problem that after removal of the resist pattern, resist residues are left in recesses of the photomask pattern, causing defects.

The preferred embodiment, wherein the second and fourth films are constructed such that the etching clear time of the fourth film is longer than the etching clear time of the second film during chlorine base dry etching under the same set of conditions, ensures that even though the fourth film is exposed to chlorine base dry etching while the mask pattern of the third film is used to form a mask pattern of the second film, the fourth film can be retained after formation of the mask pattern of the second film, and that the fourth film can be retained where an outer frame pattern of the third film is to be formed, for protecting the third film, while the mask pattern of the second film is used to form a mask pattern of the first film or to form a pattern in the substrate. As a result, the third film can be retained as the outer frame pattern.

In the above embodiment, a ratio of the etching clear time of the fourth film to the etching clear time of the second film is more than 1, preferably at least 1.5, more preferably at least 2, and preferably up to 5, more preferably up to 4. Where the second and fourth films are formed of the same material, a ratio of etching clear time is equal to a ratio of film thickness. Where the second and fourth films are formed of different materials and hence, have different etching rates, a ratio of etching clear time is set after their etching clear times are computed from their film thicknesses and etching rates.

The first film is formed of a material which is resistant to chlorine base dry etching and removable by fluorine base dry etching. For this requirement, silicon-containing materials are adequate. Suitable silicon-containing materials include silicon alone, silicon compounds containing silicon and at least one element selected from oxygen, nitrogen and carbon, such as silicon oxide (SiO), silicon nitride (SiN), and silicon oxynitride (SiON); and transition metal/silicon compounds containing transition metal (Me), silicon and at least one element selected from oxygen, nitrogen and carbon, such as transition metal/silicon oxide (MeSiO), transition metal/silicon nitride (MeSiN), transition metal/silicon carbide (MeSiC), transition metal/silicon oxynitride (MeSiON), transition metal/silicon oxycarbide (MeSiOC), transition metal/silicon nitride carbide (MeSiNC), and transition metal/silicon oxide nitride carbide (MeSiONC). Examples of the transition metal (Me) include titanium (Ti), vanadium (V), cobalt (Co), nickel (Ni), zirconium (Zr), niobium (Nb), molybdenum (Mo), hafnium (Hf), tantalum (Ta), and tungsten (W), with molybdenum (Mo) being preferred for dry etching amenability. Preferably the silicon-containing materials are free of chromium (Cr). The thickness of the first film is preferably at least 40 nm, more preferably at least 60 nm and up to 85 nm, more preferably up to 80 nm.

Preferably the first film is a phase shift film, typically halftone phase shift film. When a phase shift film, typically halftone phase shift film is included as the first film, the photomask blank is a phase shift photomask blank, typically halftone phase shift photomask blank, from which a phase shift photomask, typically halftone phase shift photomask is prepared.

The phase shift of the phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is 150 to 200 degrees. Although ordinary phase shift films are set to a phase shift of approximately 180°, it is possible from the standpoint of contrast enhancement to adjust the phase shift below or beyond 180°. For example, a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°. Where the phase shift film is a halftone phase shift film, it has a transmittance of exposure light which is preferably at least 3%, more preferably at least 5%, and up to 30%.

Where the first film is a phase shift film, typically halftone phase shift film, it is preferably formed of a silicon compound containing silicon and at least one element selected from oxygen and nitrogen, or a transition metal/silicon compound containing transition metal (Me), silicon and at least one element selected from oxygen, nitrogen and carbon. In the case of silicon compound, the silicon content is preferably at least 30 at %, more preferably at least 40 at % and up to 80 at %, more preferably up to 60 at %. The oxygen content is preferably at least 0 at % and up to 60 at %, more preferably up to 20 at %. The nitrogen content is preferably at least 10 at %, more preferably at least 30 at % and up to 65 at %, more preferably up to 60 at %. In the case of transition metal/silicon compound, the transition metal (Me) content is preferably at least 0.1 at %, more preferably at least 1 at % and up to 30 at %, more preferably up to 20 at %. The silicon content is preferably at least 25 at %, more preferably at least 30 at % and up to 80 at %, more preferably up to 60 at %. The oxygen content is preferably at least 0 at %, more preferably at least 5 at % and up to 70 at %, more preferably up to 20 at %. The nitrogen content is preferably at least 10 at %, more preferably at least 25 at % and up to 60 at %, more preferably up to 57 at %. The carbon content is preferably up to 10 at %, more preferably up to 5 at %. The thickness of the phase shift film is preferably up to 80 nm, more preferably up to 70 nm, and even more preferably up to 65 nm, because a thinner film is easier to form a fine pattern. The lower limit of the thickness of the phase shift film is set in the range where the desired optical properties are obtained relative to exposure light of wavelength up to 200 nm, typically ArF excimer laser light (193 nm). Most often the film thickness is set at least 40 nm, though not critical.

The second film is formed of a material which is resistant to fluorine base dry etching and removable by chlorine base dry etching. For this requirement, chromium-containing materials are adequate. Suitable chromium-containing materials include chromium, chromium compounds containing chromium and at least one element selected from oxygen, nitrogen and carbon, such as chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC). The chromium-containing materials may further contain tin (Sn), indium (In) or the like, but are preferably free of silicon. The thickness of the second film is preferably at least 1 nm, more preferably at least 3 nm, even more preferably at least 40 nm and up to 100 nm, more preferably up to 70 nm.

The second film is preferably a light shielding film. When a light shielding film is deposited as the second film on the transparent substrate without interposing the first film therebetween, preferably when the light shielding film as the second film is deposited contiguous to the substrate, the resulting photomask blank is a binary photomask blank, from which a binary photomask is prepared.

Where the second film is a light shielding film, it is preferably formed of chromium alone or chromium compound containing chromium and at least one element selected from oxygen, nitrogen and carbon. In the case of chromium compound, the chromium content is preferably at least 30 at %, more preferably at least 35 at % and less than 100 at %, more preferably up to 99 at %, even more preferably up to 90 at %. The oxygen content is preferably at least 0 at % and up to 60 at %, more preferably up to 50 at %. Optical properties may be adjusted by incorporating oxygen, especially at least 1 at % of oxygen. The nitrogen content is preferably at least 0 at % and up to 50 at %, more preferably up to 40 at %. An etching rate may be adjusted by incorporating nitrogen, especially at least 1 at % of nitrogen. The carbon content is preferably at least 0 at % and up to 30 at %, more preferably up to 20 at %. An etching rate may be adjusted by incorporating carbon, especially at least 1 at % of carbon. The total content of chromium, oxygen, nitrogen and carbon is preferably at least 95 at %, more preferably at least 99 at %, and most preferably 100 at %. The light shielding film preferably has a thickness of at least 15 nm, more preferably at least 30 nm, and up to 100 nm, more preferably up to 50 mn. The light shielding film may be a multilayer film, for example, including a light shielding layer and an antireflective layer.

While the outer frame pattern or a light shielding portion within a photomask pattern region in the photomask should have a degree of light shielding enough to substantially shield exposure light, the second film in the form of a light shielding film provides the necessary degree of light shielding. The first and second films, if the first film is included, or the second film alone should preferably have a (total) optical density of at least 2, more preferably at least 2.5, and even more preferably at least 3 relative to exposure light of wavelength up to 200 nm, typically ArF excimer laser light (193 nm). A (total) optical density of up to 5 is preferred because a higher optical density requires an increase of film thickness.

The second film should preferably have a sheet resistance of up to 10,000 ohm/square ($\Omega/\square$), for the reason that when an EB resist is formed on the third film, EB imaging is possible without charge build-up.

The third film is formed of a material which is resistant to chlorine base dry etching and removable by fluorine base dry etching. Adequate materials are as exemplified for the first film. Preferably the third film is thinner than the second film. Specifically, the difference in thickness between the second film and the third film is preferably at least 30 nm, more preferably at least 35 nm, or the thickness of the third film is preferably up to ½, more preferably up to ⅓ of the thickness of the second film. Preferably the third film is thinner than the fourth film. Specifically, the difference in thickness between the fourth film and the third film is preferably at least 50 nm, more preferably at least 60 nm, or the thickness of the third film is preferably up to ⅓, more preferably up to ¼ of the thickness of the fourth film. The thickness of the third film is preferably at least 1 nm, more preferably at least 2 nm, and up to 80 nm, more preferably up to 70 nm.

The third film is preferably a hard mask film. In particular, the third film is preferably a film which functions as a hard mask in pattern formation of a photomask pattern region, more preferably a film for improving the photomask pattern loading effect of etching. The third film is also preferably a film in which a pattern is directly formed from the resist pattern using the resist pattern as etching mask. Where the third film is a hard mask film, it is preferably formed of a silicon compound containing silicon and at least one element selected from oxygen and nitrogen or a transition metal/silicon compound containing transition metal (Me), silicon and at least one element selected from oxygen and nitrogen. The silicon content is preferably at least 20 at %, more preferably at least 33 at % and up to 95 at %, more preferably up to 80 at %. The oxygen content is preferably at least 0 at %, more preferably at least 20 at % and up to 70 at %, more preferably up to 66 at %. An oxygen content of at least 1 at % is preferable when an etching rate must be adjusted. The nitrogen content is preferably at least 0 at % and up to 50 at %, more preferably up to 40 at %. A nitrogen content of at least 1 at % is preferable when an etching rate must be adjusted. The content of transition metal is preferably at least 0 at % and up to 35 at %, more preferably up to 20 at %. When transition metal is contained, its content is preferably at least 1 at %. The total content of silicon, oxygen, nitrogen and transition metal is preferably at least 95 at %, more preferably at least 99 at %, and most preferably 100 at %. The third film is adequate as a hard mask for forming a photomask pattern in the photomask pattern-forming region. The hard mask film preferably has a thickness of at least 1 nm and up to 20 nm, more preferably at least 2 nm, even more preferably at least 4 nm, especially at least 8 nm, and up to 15 nm.

While the outer frame pattern in the photomask should have a degree of light shielding enough to substantially shield exposure light, the first and second films alone, or the second film alone, optionally in combination with the third film, may provide the necessary degree of light shielding. In this case, the first, second and third films, if the first film is included, or the second and third films should preferably have a total optical density of at least 2, more preferably at least 2.5, and even more preferably at least 3 relative to exposure light of wavelength up to 200 nm, typically ArF excimer laser light (193 nm). A total optical density of up to 5 is preferred because a higher optical density requires an increase of film thickness.

The fourth film is formed of a material which is resistant to fluorine base dry etching and removable by chlorine base dry etching. Adequate materials are as exemplified for the second film. Preferably the fourth film is formed of chromium alone or chromium compounds containing chromium and at least one element selected from oxygen, nitrogen and carbon. In the case of chromium compound, the chromium content is preferably at least 30 at %, more preferably at least 35 at % and less than 100 at %, more preferably up to 99 at %, even more preferably up to 90 at %. The oxygen content is preferably at least 0 at % and up to 60 at %, more preferably up to 40 at %. An etching rate may be adjusted by incorporating oxygen, especially at least 1 at % of oxygen. The nitrogen content is preferably at least 0 at % and up to 50 at %, more preferably up to 40 at %. An etching rate may be adjusted by incorporating nitrogen, especially at least 1 at % of nitrogen. The carbon content is preferably at least 0 at % and up to 30 at %, more preferably up to 20 at %. An etching rate may be adjusted by incorporating carbon, especially at least 1 at % of carbon. The total content of chromium, oxygen, nitrogen and carbon is preferably at least 95 at %, more preferably at least 99 at %, and most preferably 100 at %. The fourth film is adequate as a hard mask for forming an outer frame pattern. The thickness of the fourth film is preferably at least 30 nm and up to 120 nm, more preferably more than 30 nm, even more preferably at least 40 nm, especially at least 60 nm, and up to 100 nm, more preferably up to 90 nm.

While the outer frame pattern in the photomask should have a degree of light shielding enough to substantially shield exposure light, the first and second films alone, or the second film alone, optionally in combination with the third and fourth films, may provide the necessary degree of light shielding. In this case, the first, second and third films, if the first film is included, and the fourth film after processing into a photomask, or the second and third films and the fourth film after processing into a photomask should preferably have a total optical density of at least 2, more preferably at least 2.5, and even more preferably at least 3 relative to exposure light of wavelength up to 200 nm, typically ArF excimer laser light (193 nm). A total optical density of up to 5 is preferred because a higher optical density requires an increase of film thickness.

The films in the photomask blank may be deposited by the sputtering method. The method may be either DC sputtering or RF sputtering while any well-known techniques may be employed.

When a film of a material containing oxygen, nitrogen and carbon is deposited, reactive sputtering is preferred. The reactive sputtering method may use an inert gas and a reactive gas as the sputtering gas, specifically an inert gas such as helium gas (He), neon gas (Ne) or argon gas (Ar) and a reactive gas such as oxygen-containing gas, nitrogen-containing gas and/or carbon-containing gas, e.g., oxygen gas ($O_2$ gas), nitrogen oxide gas ($N_2O$ gas, $NO_2$ gas), nitrogen gas ($N_2$ gas), and/or carbon oxide gas (CO gas, $CO_2$ gas). Any of these gases may be combined so as to give the desired composition. Where the film is constructed by a plurality of layers, for example, where a film whose composition is graded stepwise or continuously in thickness direction is formed, for example, sputtering may be carried out while changing the composition of sputtering gas stepwise or continuously.

The pressure during sputter deposition may be selected as appropriate depending on the stress, chemical resistance and cleaning resistance of the film. The pressure is preferably at least 0.01 Pa, more preferably at least 0.03 Pa and up to 1 Pa, more preferably up to 0.3 Pa, because chemical resistance is improved in the range. The flow rates of gases may be selected so as to give the desired composition, typically in a range of 0.1 to 100 sccm. When the inert gas is used along with the reactive gas, the flow rate ratio of reactive gas to inert gas is preferably up to 5.0.

When the first and third films are formed of silicon-containing materials, they may be deposited by a sputtering method using as the target a silicon target, a silicon nitride target, a target containing both silicon and silicon nitride, a composite target containing silicon and transition metal, or a silicon-containing target and a transition metal target. On the other hand, when the second and fourth films are formed of chromium-containing materials, they may be deposited by a sputtering method using as the target a chromium target or a target containing chromium and at least one element selected from among oxygen, nitrogen and carbon. The power applied across the target may be selected as appropriate depending on the size of the target, cooling efficiency and ease of control of deposition. Typically the power per surface area of a target to be sputtered is 0.1 to 10 $W/cm^2$.

The photomask blank constructed as above may be processed into a photomask. In preparing a photomask from the photomask blank, any well-known methods may be used. For example, a film of chemically amplified photoresist, especially organic chemically amplified photoresist adapted for EB lithography is coated, a resist pattern is formed therefrom, and plural films on the substrate or plural films and the substrate are patterned in sequence by effecting either chlorine or fluorine base dry etching, depending on the etching properties of a film to be etched, while using as etching mask the resist pattern or a mask pattern formed from an overlying film in the photomask blank during the photomask preparation process.

Figure 1B:
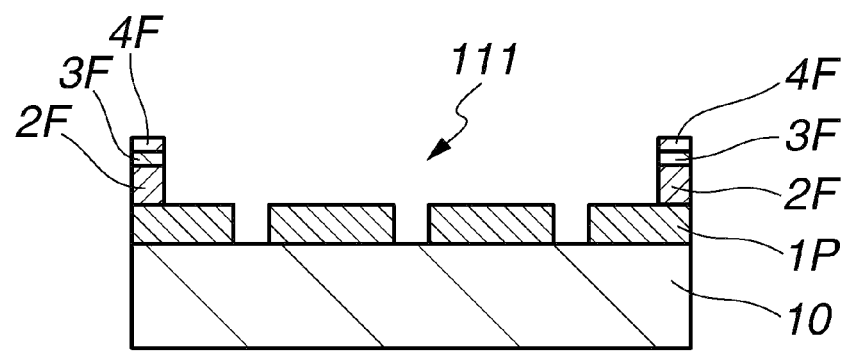
FIG. 1B is a cross-sectional view of a photomask in a first embodiment.

From the photomask blank having first, second, third and fourth films on a transparent substrate according to the first embodiment, a photomask having first, second, third and fourth films may be prepared. Specifically, from a photomask blank 11 as shown in FIG. 1A, a photomask 111 of the first embodiment as shown in FIG. 1B is obtainable, the photomask 111 including a transparent substrate 10, a photomask pattern 1P of the first film, an outer frame pattern 2F of the second film formed on the outer periphery of the substrate 10 contiguous to the first photomask pattern 1P, an outer frame pattern 3F of the third film formed contiguous to the second film outer frame pattern 2F, and an outer frame pattern 4F of the fourth film formed contiguous to the third film outer frame pattern 3F.

Figure 4A:
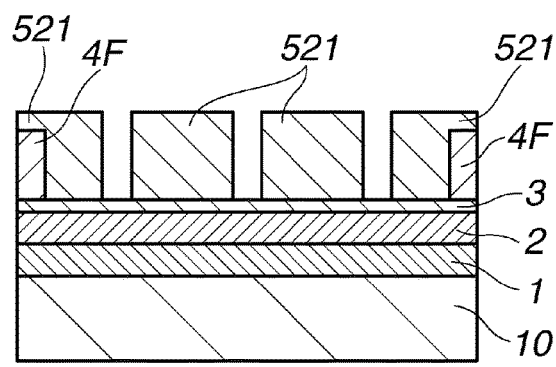
FIGS. 4A to 4E illustrate in cross-sectional view successive steps of method (I), following FIG. 3F.
Figure 4D:
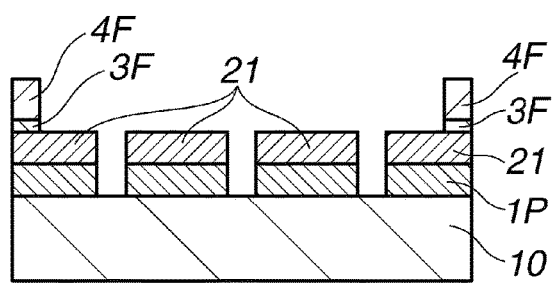
Figure 4B:
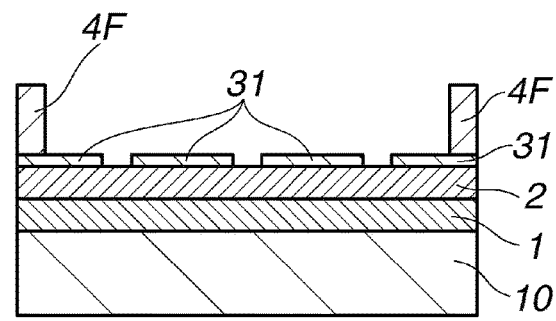
Figure 4E:
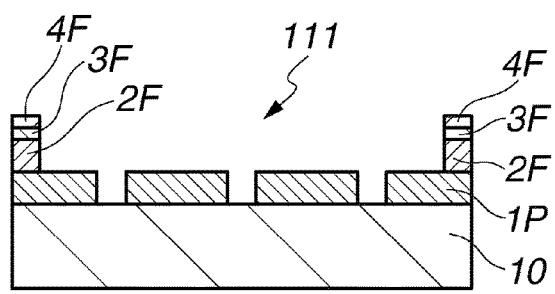
Figure 4C:
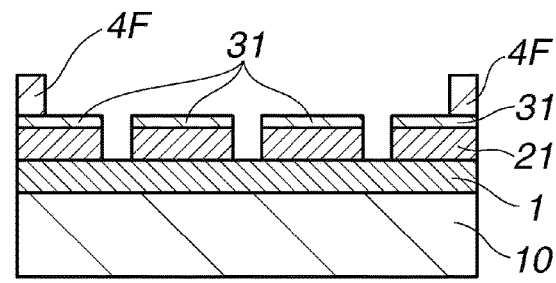
Figure 5A:
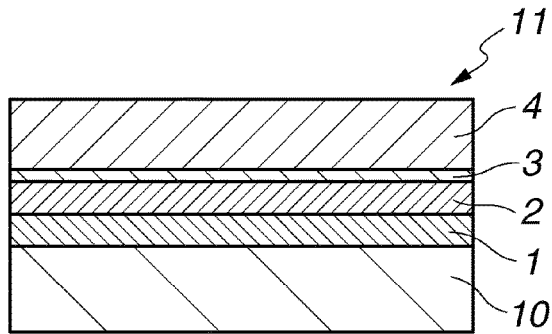
FIGS. 5A to 5F illustrate in cross-sectional view successive steps of another exemplary method (II) for preparing a photomask of the second embodiment from a photomask blank of the first embodiment of the invention.
Figure 5D:
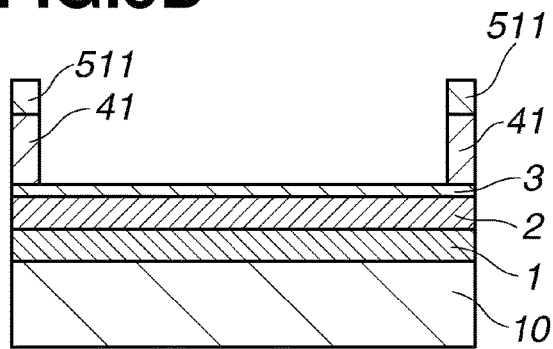
Figure 5B:
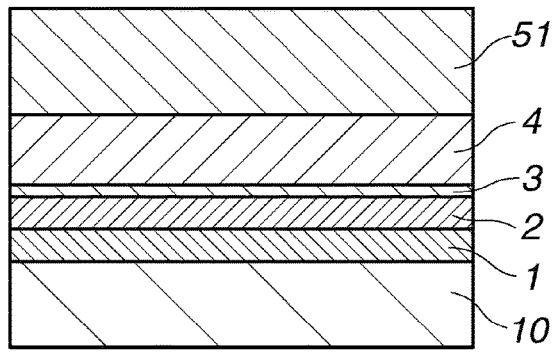
Figure 5E:
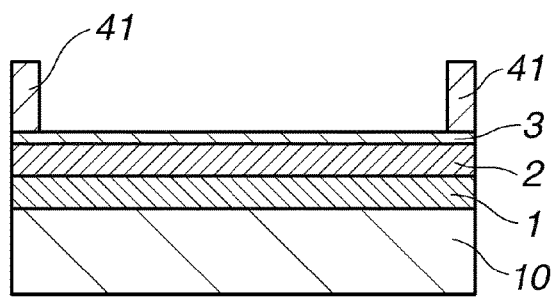
Figure 5C:
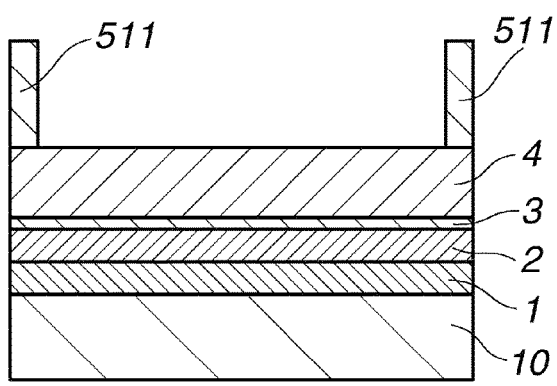
Figure 5F:
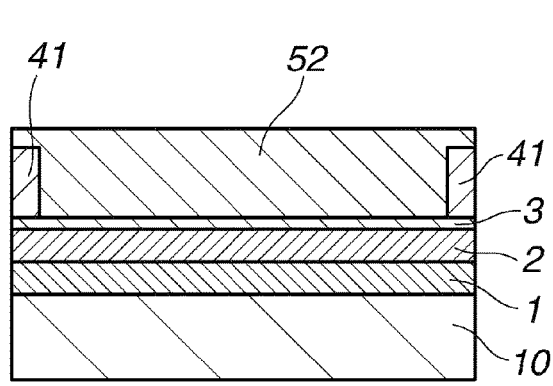

The photomask 111 of the first embodiment may be prepared by a method (I) comprising steps as shown in FIGS. 3 and 4, specifically step (1) of furnishing a photomask blank 11 of the first embodiment (FIG. 3A), step (2) of coating a first resist film 51 on the fourth film 4 (FIG. 3B), step (3) of processing the first resist film 51 to form a first resist pattern 511 in a portion where an outer frame pattern is to be formed (FIG. 3C), step (4) of chlorine base dry etching, with the first resist pattern 511 made etching mask, a portion of the fourth film 4 which is not covered with the first resist pattern 511, to form a fourth film outer frame pattern 4F (FIG. 3D), step (5) of removing the first resist pattern 511 (FIG. 3E), step (6) of coating a second resist film 52 on the fourth film outer frame pattern 4F and the exposed portion of the third film 3 (FIG. 3F), step (7) of processing the second resist film 52 to form a second resist pattern 521 in a portion where a photomask pattern is to be formed (FIG. 4A), step (8) of fluorine base dry etching, with the second resist pattern 521 made etching mask, a portion of the third film 3 which is not covered with the second resist pattern 521, to form a third film mask pattern 31 (FIG. 4B), step (9) of chlorine base dry etching, with the third film mask pattern 31 made etching mask, a portion of the second film 2 which is not covered with the third mask pattern 31, to form a second film mask pattern 21 and if the fourth film outer frame pattern 4F is exposed, to reduce its height to such an extent that the fourth film outer frame pattern 4F is retained (FIG. 4C), step (10) of fluorine base dry etching, with the fourth film outer frame pattern 4F made etching mask, a portion of the third film 3 which is not covered with the fourth film outer frame pattern 4F, to form a third film outer frame pattern 3F and with the second film mask pattern 21 made etching mask, a portion of the first film 1 which is not covered with the second mask pattern 21, to form a first film photomask pattern 1P (FIG. 4D), and step (11) of chlorine base dry etching, with the third film outer frame pattern 3F made etching mask, to remove a portion of the second film mask pattern 21 which is not covered with the third film outer frame pattern 3F, to form a second film outer frame pattern 2F and if the fourth film outer frame pattern 4F is exposed, to reduce its height to such an extent that the fourth film outer frame pattern 4F is retained (FIG. 4E).

If the second resist pattern 521 is left after step (8), the method (I) may include step (12) of removing the second resist pattern 521 after any of steps (8) to (11), preferably between steps (8) and (9). Although FIGS. 4B, 4C, 4D and 4E show that the second resist pattern 521 is absent, the second resist pattern 521 may be left at these steps. The state of FIGS. 4B, 4C, 4D and 4E that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed.

Figure 1C:
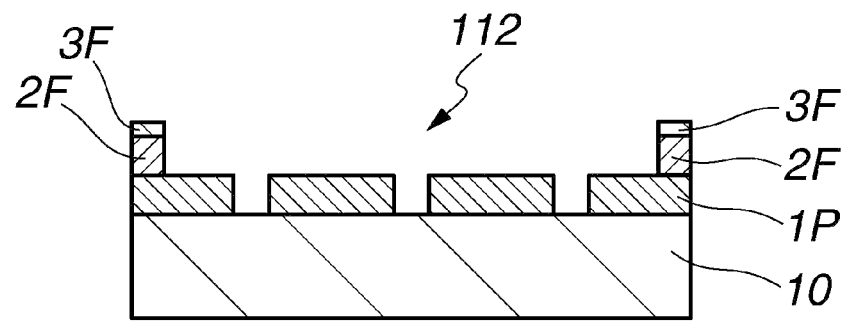
FIG. 1C is a cross-sectional view of a photomask in a second embodiment.

From the photomask blank of the first embodiment, a photomask having first, second, and third films may be prepared. Specifically, from a photomask blank 11 as shown in FIG. 1A, a photomask 112 of the second embodiment as shown in FIG. 1C is obtainable, the photomask 112 including a transparent substrate 10, a photomask pattern 1P of the first film, an outer frame pattern 2F of the second film formed on the outer periphery of the substrate 10 contiguous to the first photomask pattern 1P, and an outer frame pattern 3F of the third film formed contiguous to the second film outer frame pattern 2F.

Figure 6A:
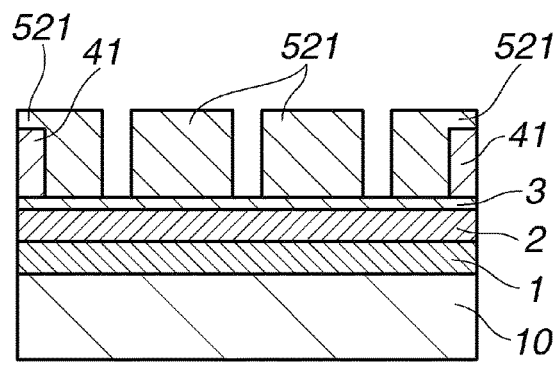
FIGS. 6A to 6E illustrate in cross-sectional view successive steps of method (II), following FIG. 5F.
Figure 6D:
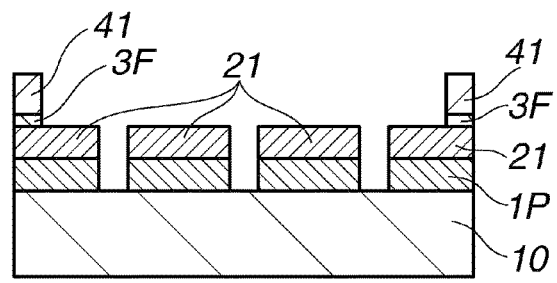
Figure 6B:
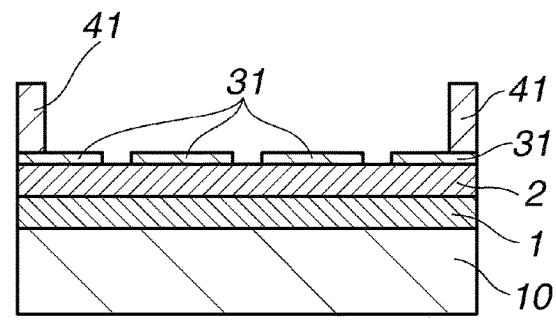
Figure 6E:
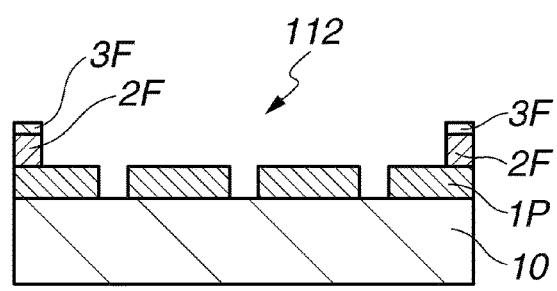

The photomask 112 of the second embodiment may be prepared by a method (II) comprising steps as shown in FIGS. 5 and 6, specifically step (1) of furnishing a photomask blank 11 of the first embodiment (FIG. 5A), step (2) of coating a first resist film 51 on the fourth film 4 (FIG. 5B), step (3) of processing the first resist film 51 to form a first resist pattern 511 in a portion where an outer frame pattern is to be formed (FIG. 5C), step (4') of chlorine base dry etching, with the first resist pattern 511 made etching mask, a portion of the fourth film 4 which is not covered with the first resist pattern 511, to form a fourth film mask pattern 41 (FIG. 5D), step (5) of removing the first resist pattern 511 (FIG. 5E), step (6') of coating a second resist film 52 on the fourth film mask pattern 41 and the exposed portion of the third film 3 (FIG. 5F), step (7) of processing the second resist film 52 to form a second resist pattern 521 in a portion where a photomask pattern is to be formed (FIG. 6A), step (8) of fluorine base dry etching, with the second resist pattern 521 made etching mask, a portion of the third film 3 which is not covered with the second resist pattern 521, to form a third film mask pattern 31 (FIG. 6B), step (9') of chlorine base dry etching, with the third film mask pattern 31 made etching mask, a portion of the second film 2 which is not covered with the third mask pattern 31, to form a second film mask pattern 21 and if the fourth film mask pattern 41 is exposed, to reduce its height to such an extent that the fourth film mask pattern 41 is retained (FIG. 6C), step (10') of fluorine base dry etching, with the fourth film mask pattern 41 made etching mask, a portion of the third film mask pattern 31 which is not covered with the fourth film mask pattern 41, to form a third film outer frame pattern 3F and with the second film mask pattern 21 made etching mask, a portion of the first film 1 which is not covered with the second mask pattern 21, to form a first film photomask pattern 1P (FIG. 6D), and step (11') of chlorine base dry etching to remove the fourth mask pattern 41 completely and to remove a portion of the second film mask pattern 21 which is not covered with the third film outer frame pattern 3F, to form a second film outer frame pattern 2F (FIG. 6E).

Figure 6C:
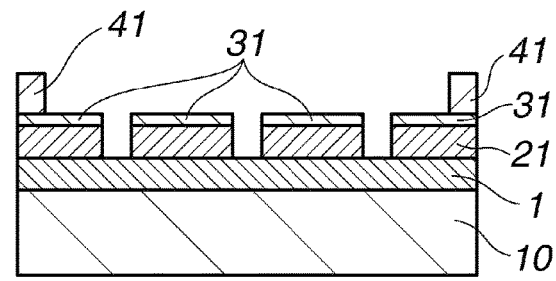
Figure 7A:
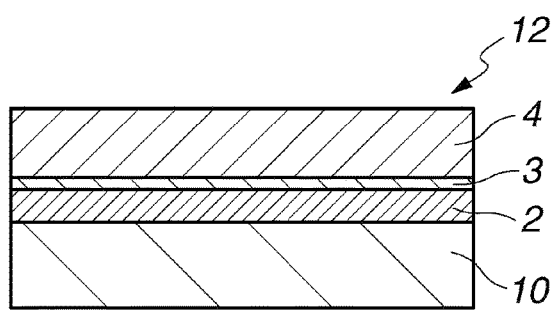
FIGS. 7A to 7F illustrate in cross-sectional view successive steps of a further exemplary method (III) for preparing a photomask of the third embodiment from a photomask blank of the second embodiment of the invention.
Figure 7D:
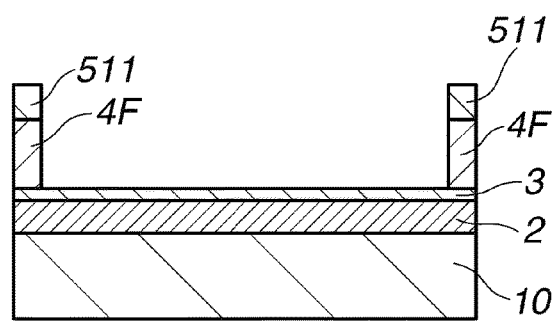
Figure 7B:
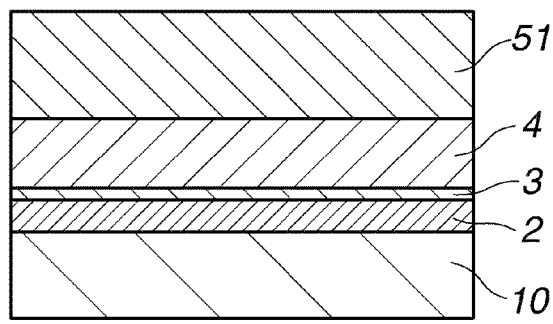
Figure 7E:
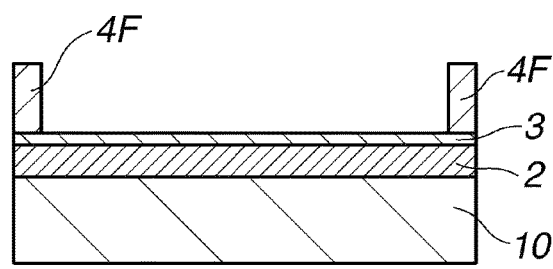
Figure 7C:
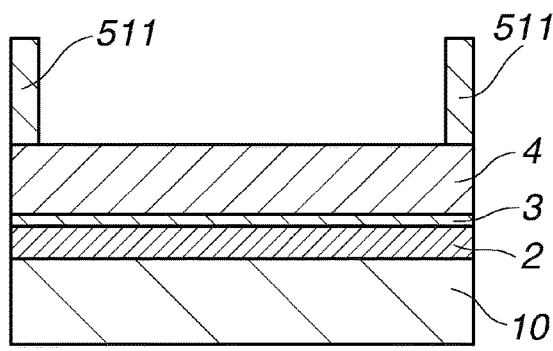
Figure 7F:
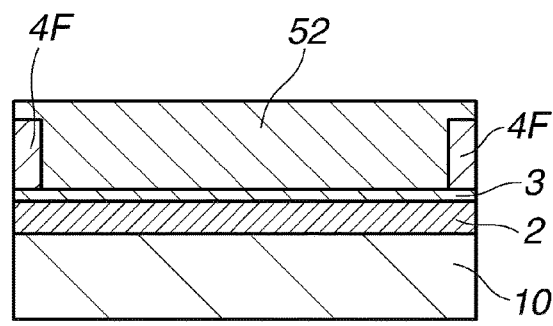

If the second resist pattern 521 is left at any step from the end of step (8) to prior to step (11'), the method (II) may include step (12) of removing the second resist pattern 521 after any of steps (8) to (10'), preferably between steps (8) and (9'). Although FIGS. 6B, 6C and 6D show that the second resist pattern 521 is absent, the second resist pattern 521 may be left at these steps. The state of FIGS. 6B, 6C and 6D that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed.

Figure 2B:
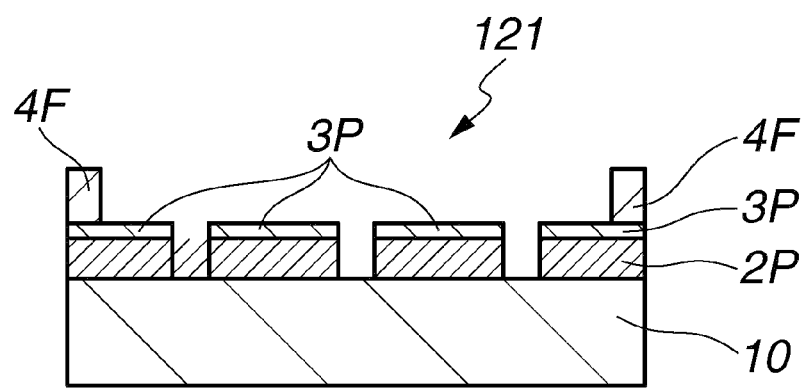
FIG. 2B is a cross-sectional view of a photomask in a third embodiment.

From the photomask blank having second, third and fourth films on a transparent substrate according to the second embodiment, a photomask having second, third and fourth films may be prepared. Specifically, from a photomask blank 12 as shown in FIG. 2A, a photomask 121 of the third embodiment as shown in FIG. 2B is obtainable, the photomask 121 including a transparent substrate 10, a photomask pattern 2P of the second film, a photomask pattern 3P of the third film formed contiguous to the second photomask pattern 2P, and an outer frame pattern 4F of the fourth film formed on the outer periphery of the substrate 10 contiguous to the third film photomask pattern 3P.

Figure 8A:
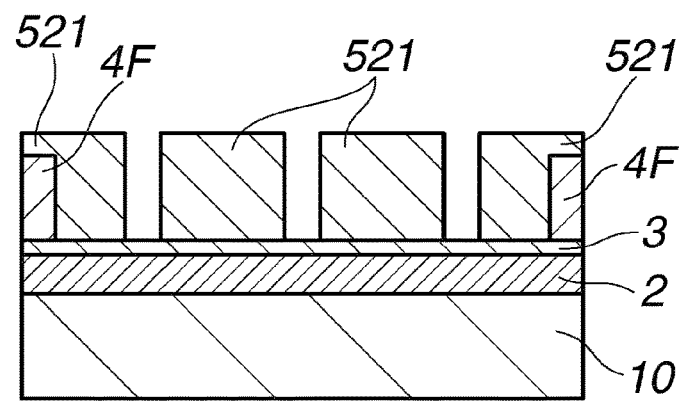
FIGS. 8A to 8C illustrate in cross-sectional view successive steps of method (III), following FIG. 7F.
Figure 8B:
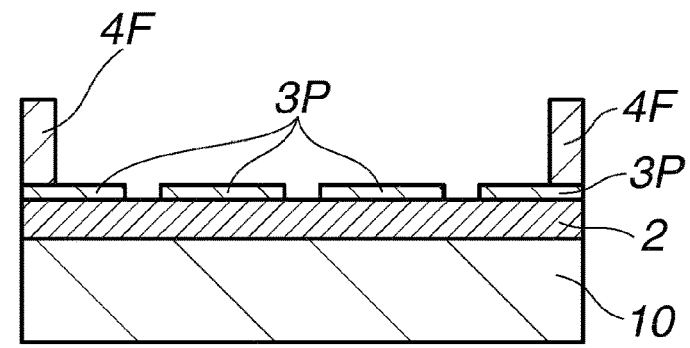
Figure 8C:
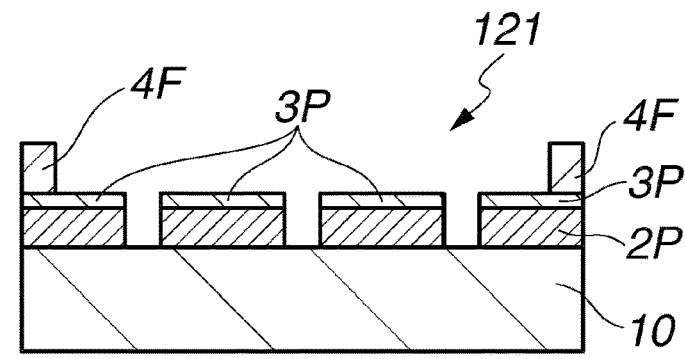
Figure 9A:
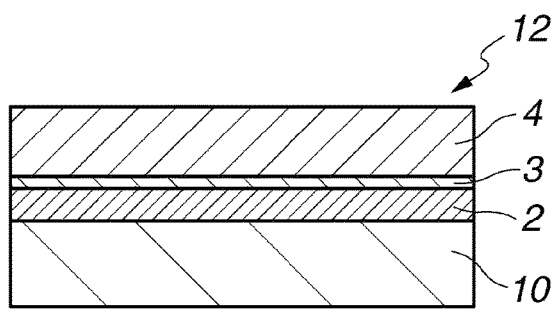
FIGS. 9A to 9F illustrate in cross-sectional view successive steps of a further exemplary method (IV) for preparing a photomask of the fourth embodiment from a photomask blank of the second embodiment of the invention.
Figure 9D:
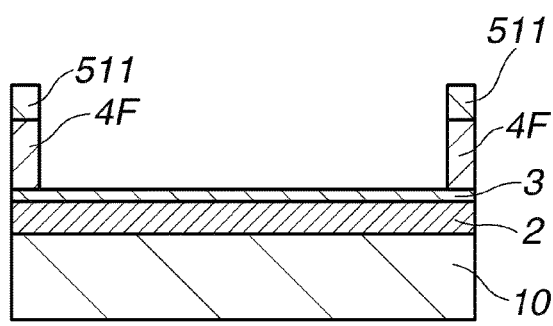
Figure 9B:
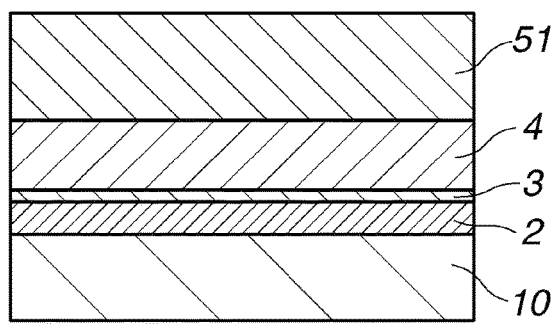
Figure 9E:
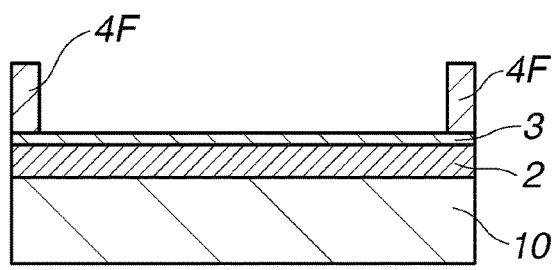
Figure 9C:
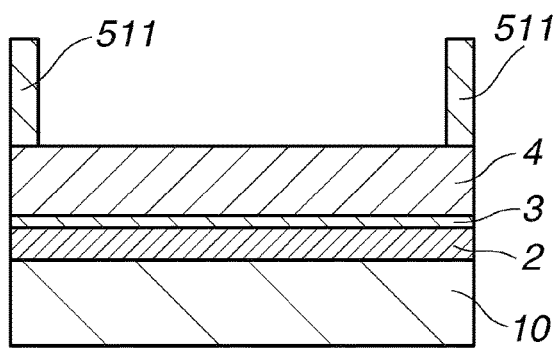
Figure 9F:
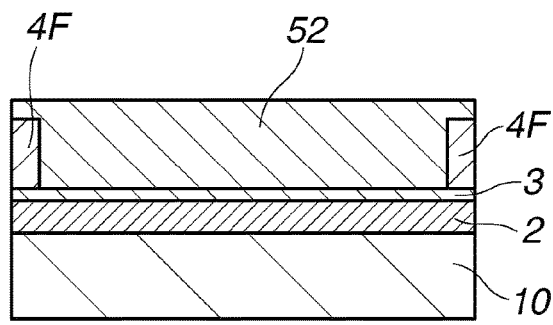

The photomask 121 of the third embodiment may be prepared by a method (III) comprising steps as shown in FIGS. 7 and 8, specifically step (1') of furnishing a photomask blank 12 of the second embodiment (FIG. 7A), step (2) of coating a first resist film 51 on the fourth film 4 (FIG. 7B), step (3) of processing the first resist film 51 to form a first resist pattern 511 in a portion where an outer frame pattern is to be formed (FIG. 7C), step (4) of chlorine base dry etching, with the first resist pattern 511 made etching mask, a portion of the fourth film 4 which is not covered with the first resist pattern 511, to form a fourth film outer frame pattern 4F (FIG. 7D), step (5) of removing the first resist pattern 511 (FIG. 7E), step (6) of coating a second resist film 52 on the fourth film outer frame pattern 4F and the exposed portion of the third film 3 (FIG. 7F), step (7) of processing the second resist film 52 to form a second resist pattern 521 in a portion where a photomask pattern is to be formed (FIG. 8A), step (8') of fluorine base dry etching, with the second resist pattern 521 made etching mask, a portion of the third film 3 which is not covered with the second resist pattern 521, to form a third film photomask pattern 3P (FIG. 8B), step (9") of chlorine base dry etching, with the third film photomask pattern 3P made etching mask, a portion of the second film 2 which is not covered with the third photomask pattern 3P, to form a second film photomask pattern 2P and if the fourth film outer frame pattern 4F is exposed, to reduce its height to such an extent that the fourth film outer frame pattern 4F is retained (FIG. 8C).

If the second resist pattern 521 is left after step (8'), the method (I) may include step (12) of removing the second resist pattern 521 after any of steps (8') to (9"), preferably between steps (8') and (9"). Although FIGS. 8B and 8C show that the second resist pattern 521 is absent, the second resist pattern 521 may be left at these steps. The state of FIGS. 8B and 8C that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed.

Figure 2C:
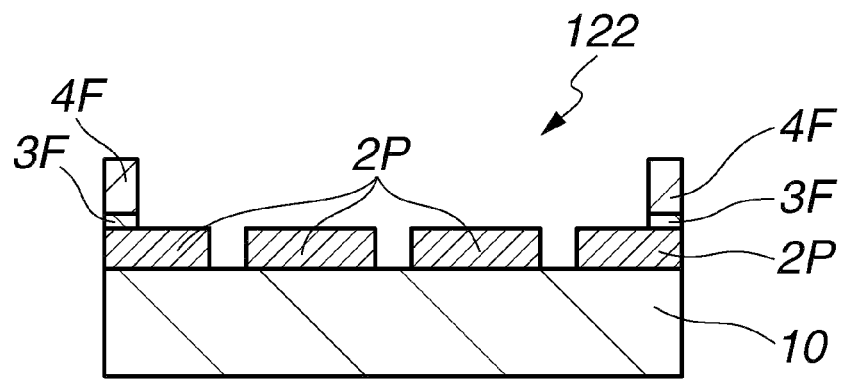
FIG. 2C is a cross-sectional view of a photomask in a fourth embodiment.
Figure 3A:
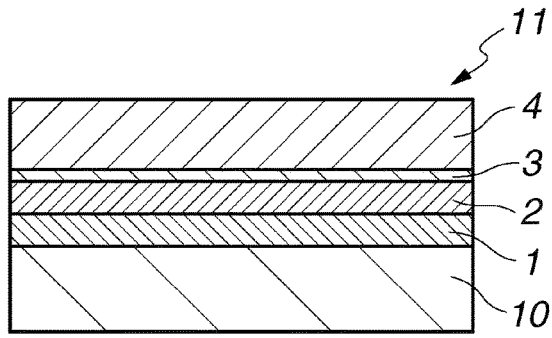
FIGS. 3A to 3F illustrate in cross-sectional view successive steps of an exemplary method (I) for preparing a photomask of the first embodiment from a photomask blank of the first embodiment of the invention.
Figure 3D:
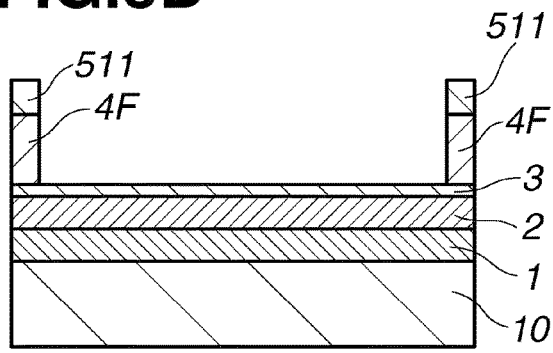
Figure 3B:
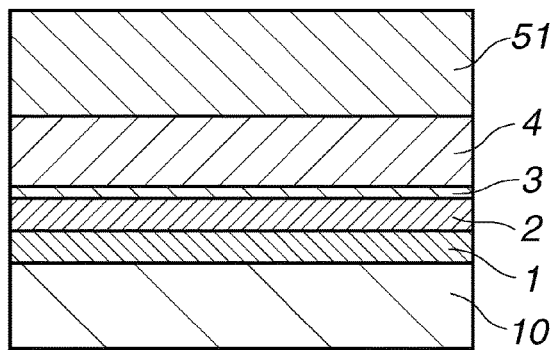
Figure 3E:
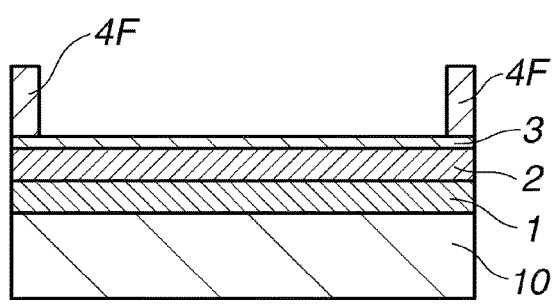
Figure 3C:
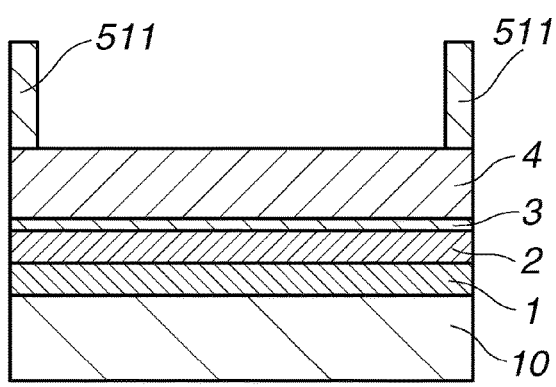
Figure 3F:
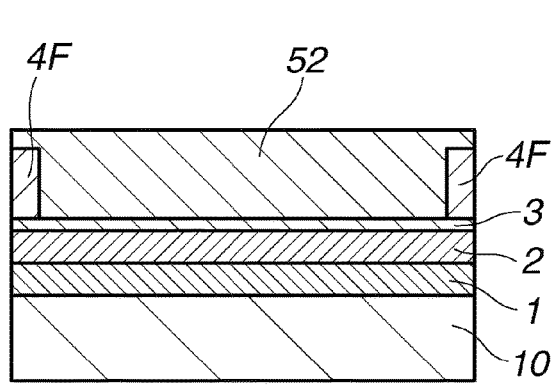

From the photomask blank of the second embodiment, a photomask having second, third and fourth films may be prepared. Specifically, from a photomask blank 12 as shown in FIG. 2A, a photomask 122 of the fourth embodiment as shown in FIG. 2C is obtainable, the photomask 122 including a transparent substrate 10, a photomask pattern 2P of the second film, an outer frame pattern 3F of the third film formed on the outer periphery of the substrate 10 contiguous to the second photomask pattern 2P, and an outer frame pattern 4F of the fourth film formed contiguous to the third film outer frame pattern 3F.

Figure 10A:
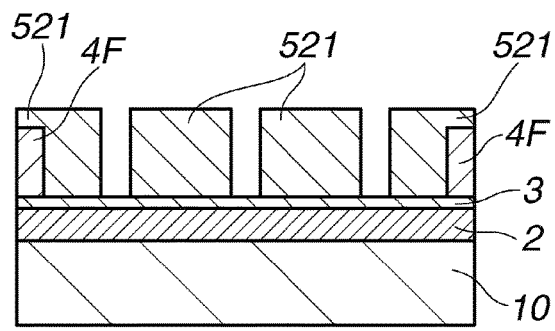
FIGS. 10A to 10D illustrate in cross-sectional view successive steps of method (IV), following FIG. 9F.
Figure 10D:
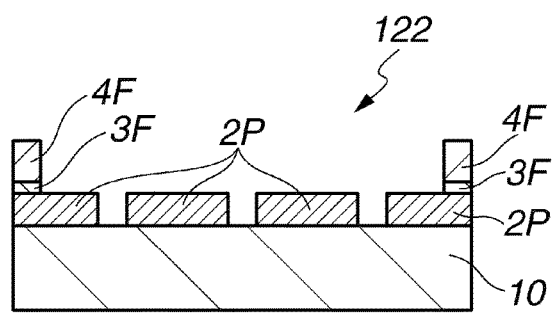

The photomask 122 of the fourth embodiment may be prepared by a method (IV) comprising steps as shown in FIGS. 9 and 10, specifically step (1') of furnishing a photomask blank 12 of the second embodiment (FIG. 9A), step (2) of coating a first resist film 51 on the fourth film 4 (FIG. 9B), step (3) of processing the first resist film 51 to form a first resist pattern 511 in a portion where an outer frame pattern is to be formed (FIG. 9C), step (4) of chlorine base dry etching, with the first resist pattern 511 made etching mask, a portion of the fourth film 4 which is not covered with the first resist pattern 511, to form a fourth film outer frame pattern 4F (FIG. 9D), step (5) of removing the first resist pattern 511 (FIG. 9E), step (6) of coating a second resist film 52 on the fourth film outer frame pattern 4F and the exposed portion of the third film 3 (FIG. 9F), step (7) of processing the second resist film 52 to form a second resist pattern 521 in a portion where a photomask pattern is to be formed (FIG. 10A), step (8) of fluorine base dry etching, with the second resist pattern 521 made etching mask, a portion of the third film 3 which is not covered with the second resist pattern 521, to form a third film mask pattern 31 (FIG. 10B), step (9) of chlorine base dry etching, with the third film mask pattern 31 made etching mask, a portion of the second film 2 which is not covered with the third mask pattern 31, to form a second film photomask pattern 2P and if the fourth film outer frame pattern 4F is exposed, to reduce its height to such an extent that the fourth film outer frame pattern 4F is retained (FIG. 10C), and step (10") of fluorine base dry etching, with the fourth film outer frame pattern 4F made etching mask, a portion of the third film mask pattern 31 which is not covered with the fourth film outer frame pattern 4F, to form a third film outer frame pattern 3F (FIG. 10D).

Figure 10B:
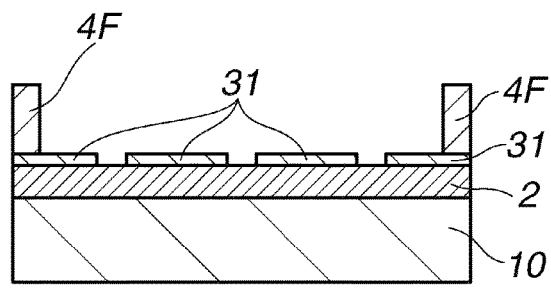
Figure 10C:
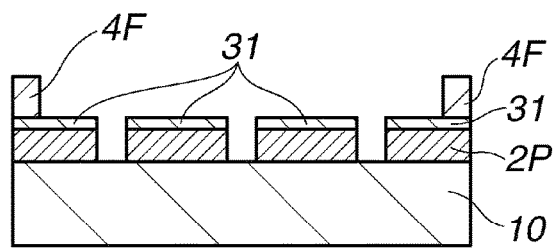
Figure 12A:
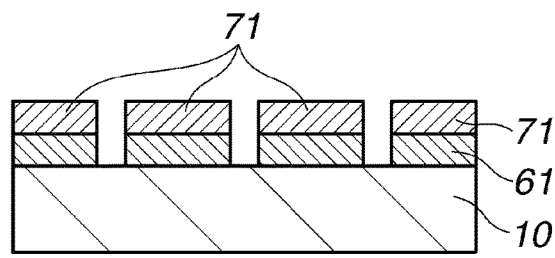
FIGS. 12A to 12E illustrate in cross-sectional view successive steps of the prior art method, following FIG. 11F.
Figure 12D:
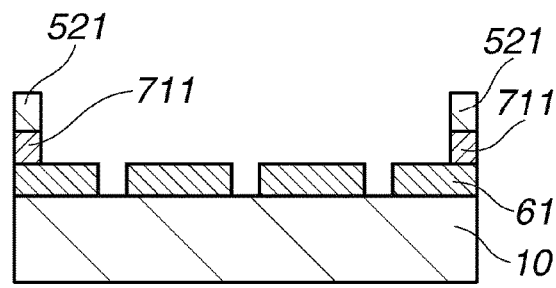
Figure 12B:
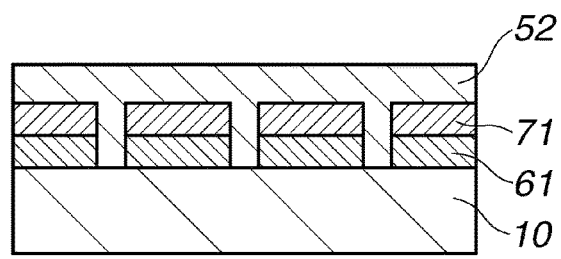
Figure 12E:
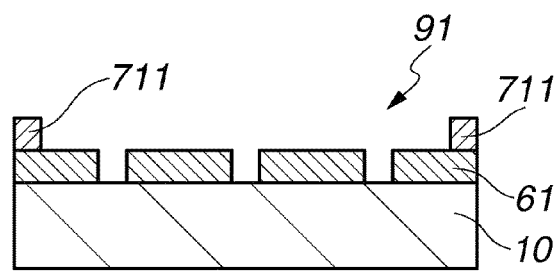
Figure 12C:
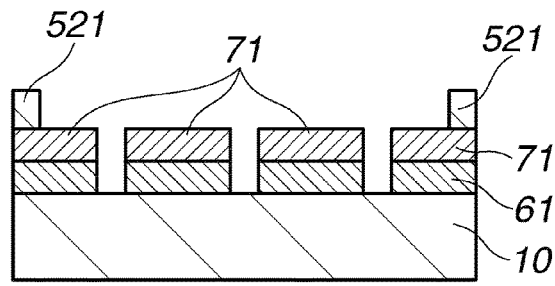

If the second resist pattern 521 is left after step (8), the method (IV) may include step (12) of removing the second resist pattern 521 after any of steps (8) to (10"), preferably between steps (8) and (9). Although FIGS. 10B, 10C and 10D show that the second resist pattern 521 is absent, the second resist pattern 521 may be left at these steps. The state of FIGS. 10B, 10C and 10D that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed.

In any methods (I) to (IV), the thickness of the first resist film may be selected appropriate in the range that the first resist pattern is not vanished by chlorine base dry etching until the end of step (4) or (4'); and the thickness of the second resist film may be selected appropriate in the range that the second resist pattern is not vanished by fluorine or chlorine base dry etching at least until the end of step (8) or (8'). In either case, a thinner resist film is preferable.

In the photomasks of the first, third and fourth embodiments, the fourth film is retained after the pattern of the second film serving as a light shielding film is processed. The first, second, third and fourth films or the second, third and fourth films provide necessary light shielding in the outer frame region. This allows the second film to be thinner. The thickness of the fourth film which is retained on the photomask after the processing of the photomask blank into the photomask is preferably at least 2 nm, more preferably at least 4 nm (although a certain film thickness reduction must be taken into account because the film thickness is gradually reduced by fluorine base dry etching), and preferably up to 55 nm, more preferably up to 50 nm because an excessive thickness is unnecessary. In the photomask of the second embodiment, as a result of removal of the fourth film, the surface of the third film is exposed, and the surface of the second film is not exposed. In this case, the first, second and third films provide necessary light shielding in the outer frame region. For example, when the transparent substrate is a 6025 substrate (6×6×0.25 inch or 152×152×6.35 mm), the outer frame pattern may be formed in an arbitrary range extending inward from the four sides of the film-forming surface, and a region inside the outer frame pattern-forming region become a photomask pattern-forming region.

In a photolithographic process for forming a pattern with a half pitch of up to 50 nm, typically up to 30 nm, more typically up to 20 nm, especially up to 10 nm in a processable substrate, comprising the steps of forming a photoresist film on the processable substrate and exposing the photoresist film to light of wavelength up to 250 nm, preferably up to 200 nm, typically ArF excimer laser (193 nm) or $F_2$ laser (157 nm), through a patterned mask for transferring the pattern to the photoresist film, the photomask of the invention is best suited for use in the exposure step.

The photomask obtained from the photomask blank is advantageously applicable to the pattern forming process comprising projecting light to the photomask pattern for transferring the photomask pattern to an object (photoresist film) on the processable substrate. The irradiation of exposure light may be either dry exposure or immersion exposure. The photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto. All optical properties including phase shift, transmittance, and optical density are as measured with respect to ArF excimer laser light (193 nm).

Example 1

A photomask blank of the first embodiment as shown in FIG. 1A was prepared by using a DC sputtering system and successively depositing films on a 6025 quartz substrate. Namely, a MoSiON film of 75 nm thick which was a halftone phase shift film having a phase shift of 177°, a transmittance of 6.0% and an optical density of 1.2 was deposited on the substrate as a first film; a CrON film of 44 nm thick which was a light shielding film having an optical density of 1.8 was deposited thereon as a second film; a SiO film of 10 nm thick which was a hard mask film having an optical density of 0.5 was deposited thereon as a third film; and a CrN film of 60 nm thick was deposited thereon as a fourth film. The first, second and third films had a total optical density of 3.5. The second film had an etching clear time of 125 seconds, and the fourth film had an etching clear time of 255 seconds, both on chlorine base dry etching under the same etching conditions.

From the photomask blank, a photomask of the first embodiment as shown in FIG. 1B was prepared by the method (I) described above. The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9). This resulted in a photomask of the first embodiment in which the outer frame pattern of the fourth film was retained.

Example 2

A photomask blank was prepared as in Example 1. From the photomask blank, a photomask of the second embodiment as shown in FIG. 1C was prepared by the method (II) described above. The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9'). This resulted in a photomask of the second embodiment in which the fourth film was not left at all.

Example 3

A photomask blank of the second embodiment as shown in FIG. 2A was prepared by using a DC sputtering system, and successively depositing films on a 6025 quartz substrate. Namely, a CrON film of 75 nm thick which was a light shielding film having an optical density of 3.0 was deposited on the substrate as a second film; a SiO film of 10 nm thick which was a hard mask film having an optical density of 0.5 was deposited thereon as a third film; and a CrN film of 110 nm thick was deposited thereon as a fourth film. The second and third films had a total optical density of 3.5. The second film had an etching clear time of 215 seconds, and the fourth film had an etching clear time of 505 seconds, both on chlorine base dry etching under the same etching conditions.

From the photomask blank, a photomask of the third embodiment as shown in FIG. 2B was prepared by the method (III) described above. The first resist film had such a thickness that the first resist pattern might not be vanished by chlorine base dry etching until the end of step (4). The second resist film had such a thickness that the second resist pattern might not be vanished by fluorine base dry etching until the end of step (8'). The second resist film was removed after the completion of step (8') and prior to step (9"). This resulted in a photomask of the third embodiment in which the outer frame pattern of the fourth film was retained.

Example 4

A photomask blank was prepared as in Example 3. From the photomask blank, a photomask of the fourth embodiment as shown in FIG. 2C was prepared by the method (IV) described above. The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9). This resulted in a photomask of the second embodiment in which the outer frame pattern of the fourth film was retained.

Japanese Patent Application No. 2017-046031 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a transparent substrate, a second film formed on the substrate optionally via a first film, a third film being a hard mask film formed contiguous to the second film, and a fourth film formed contiguous to the third film, wherein
    the first and third films are formed of materials which are resistant to chlorine base dry etching and removable by fluorine base dry etching,
    the second and fourth films are formed of materials which are resistant to fluorine base dry etching and removable by chlorine base dry etching,
    the second and fourth films are constructed such that an etching clear time of the fourth film on chlorine base dry etching under one condition is longer than an etching clear time of the second film on chlorine base dry etching under said one condition, wherein
    the third film is thinner than the second film, and
    the thickness of the third film is up to ⅓ of the thickness of the second film.

2. The photomask blank of claim 1 wherein a ratio of the etching clear time of the fourth film to the etching clear time of the second film is up to 5.

3. The photomask blank of claim 1 wherein the first film is formed on the substrate and the second film is formed contiguous to the first film.

4. The photomask blank of claim 3 wherein the first film is a phase shift film.

5. The photomask blank of claim 1 wherein the first film is absent and the second film is formed contiguous to the substrate.

6. The photomask blank of claim 1 wherein the first and third films or the third film is formed of silicon-containing materials.

7. The photomask blank of claim 1 wherein the second and fourth films are formed of silicon-free, chromium-containing materials.

8. The photomask blank of claim 1 wherein the second film is a light shielding film.

9. The photomask blank of claim 8 wherein the second film has a thickness of 15 to 100 nm.

10. The photomask blank of claim 1 wherein the third film has a thickness of 1 to 20 nm.

11. The photomask blank of claim 1 wherein the fourth film has a thickness of 30 to 120 nm.

12. The photomask blank of claim 1 wherein the difference in thickness between the second film and the third film is at least 30 nm.

13. A photomask blank comprising a transparent substrate, a second film formed on the substrate optionally via a first film, a third film being a hard mask film formed contiguous to the second film, and a fourth film formed contiguous to the third film, wherein the first and third films are formed of materials which are resistant to chlorine base dry etching and removable by fluorine base dry etching, the second and fourth films are formed of materials which are resistant to fluorine base dry etching and removable by chlorine base dry etching, the second and fourth films are constructed such that an etching clear time of the fourth film on chlorine base dry etching under one condition is longer than an etching clear time of the second film on chlorine base dry etching under said one condition, wherein the third film is thinner than the fourth film, and the difference in thickness between the fourth film and the third film is at least 50 nm, or the thickness of the third film is up to 1/6 of the thickness of the fourth film.

14. The photomask blank of claim 13 wherein a ratio of the etching clear time of the fourth film to the etching clear time of the second film is up to 5.

15. The photomask blank of claim 13 wherein the first film is formed on the substrate and the second film is formed contiguous to the first film.

16. The photomask blank of claim 15 wherein the first film is a phase shift film.

17. The photomask blank of claim 13 wherein the first film is absent and the second film is formed contiguous to the substrate.

18. The photomask blank of claim 13 wherein the first and third films or the third film is formed of silicon-containing materials.

19. The photomask blank of claim 13 wherein the second and fourth films are formed of silicon-free, chromium-containing materials.

20. The photomask blank of claim 13 wherein the second film is a light shielding film.

21. The photomask blank of claim 20 wherein the second film has a thickness of 15 to 100 nm.

22. The photomask blank of claim 13 wherein the third film has a thickness of 1 to 20 nm.

* * * * *